United States Patent [19]

Dube

[11] Patent Number: 4,636,027

[45] Date of Patent: Jan. 13, 1987

[54] HOLOGRAPHIC IMAGE PROCESSING SYSTEMS

[75] Inventor: Roger R. Dube, Tucson, Ariz.

[73] Assignee: International Business Machines Corporation, Armonk, N.Y.

[21] Appl. No.: 730,966

[22] Filed: May 6, 1985

[51] Int. Cl.[4] .............................................. G03H 1/02
[52] U.S. Cl. ...................................... 350/3.6; 364/525
[58] Field of Search ...................... 350/3.6, 3.62, 3.74, 350/3.75; 364/525

[56] References Cited

U.S. PATENT DOCUMENTS 3,284,799 11/1966 Ross ................................. 350/356 X
3,364,497 1/1968 McAdam ....................... 350/162.17

Primary Examiner—Bruce Y. Arnold
Attorney, Agent, or Firm—H. F. Somermeyer

[57] ABSTRACT

A holographic unit includes a planar array of hologram/sections disposed along a central axis. A pair of parabolic arrays of planar mirrors are symmetrically disposed on opposite sides of the hologram array such that all planar mirrors face respective ones of the hologram/sections. A hologram emitter transmits hologram-inducing light to mirrors in a first one of the parabolic arrays, and a hologram receptor receives hologram/light emitted from the hologram array via mirrors in a second one of the parabolic arrays. The emitter and receiver are respectively disposed at the focal points of the parabolic arrays. The emitter and receiver have planar arrays of photoelements oriented at identical angles with respect to the hologram array and respectively facing the mirrors. The planar array of holograms may be used for storing or processing information-bearing signals.

8 Claims, 7 Drawing Figures

APPARENT
DETECTOR
ORIENTATIONS

HOLOGRAPHIC IMAGE PROCESSING SYSTEMS

DOCUMENTS INCORPORATED BY REFERENCE

U.S. Pat. No. 3,651,485 is incorporated for its showing of circuits useful for a holographic data processing system with which the present invention may be advantageously practiced.

U.S. Pat. No. 3,912,391 is incorporated for its showing of circuits and optics useful for a holographic information storage and retrieval system with which the present invention may be advantageously practiced.

BACKGROUND OF THE INVENTION

1. Field of the Invention

The present invention relates to optical processing apparatus, particularly of the holographic type.

2. Discussion of the Prior Art

Image processing, including holograms, is usually handled through rectangular arrays of photoelements, such as gallium arsenide light-emitting diodes and photoreceptors of various types. Usually, each photoreceptor or emitting diode corresponds to a single pixel (picture element) in the image being processed. It is desired to have apparatus that can quickly process a large number of images with a minimal physical motion of apparatus and with a minimum number of photoelements. Accordingly, it is desired to have a single array of light-emitting diodes for processing all images and a single receptor array for receiving all images.

The IBM TECHNICAL DISCLOSURE BULLETIN, April 1969, Vol. 11-No. 11, pp. 1392-3, shows a single gallium arsenide diode array which is switched electronically for directing readout beams through suitable optics to a transmissive hologram or record medium. A single-receiving photo array disposed on the opposite side of the hologram plate from the gallium arsenide diode array receives the transmitted image. While this arrangement provides for switching between holograms stored in a hologram storing plate, it does not provide for efficient volumetric storage of holograms, i.e., the overlaying of holograms within an electro-optic material, such as bismuth silicon oxide. A limitation of this disclosed apparatus is the density of holograms.

U.S. Pat. No. 3,284,799 (K. F. Ross) shows arrays of amplitude detectors which receive reflected signals from a single source and commutate same through electronic scanners. Electronic scanners focus the beam being processed onto an elliptically-concave mirror which has a curvature matched with a reflector for directing all of the beams to a single detector. While this apparatus shows a single transmitter and a single receiver, it does not illustrate how to gain access to a plurality of images which may be stored in a suitable storage medium. Similarly, McAdam (U.S. Pat. No. 3,364,497) shows a linear array of mirrors reflecting light from a single source for generating an interference pattern. This patent does not suggest how to efficiently multiplex a plurality of holograms.

SUMMARY OF THE INVENTION

It is an object of the invention to provide an efficient, multiplexed access to a large plurality of volume-stored/processed holograms or other forms of optical data storage or processing.

Apparatus constructed in accordance with the invention includes a holographic medium disposed along a reference plane which in a preferred embodiment is an optical storage medium, such as an electro-optic material, disposed along the reference plane. A rectangular array of light emitters transmits pixel light to a plurality of planar mirrors disposed along a parabolic line having a center of focus at the emitter array such that the path lengths from the emitter to any of the addressable storage areas of the data storage medium are identical. An activating or reference light source, which is effectively movable circularly about a center axis in the holographic medium, provides a reference light beam at varying angles of incidence for recording the light signals in the storage medium in an overlaid but sensible manner. In the preferred form, the holograms are generated through interference patterns generated between a reference light beam and an emitted light beam for storing the information in the holographic medium as a hologram, i.e., in the frequency domain. To read out the stored information, the emitter is turned off and the reference light shines on the addressed area of the optical storage medium. The re-emitted pixels from the stored or processed holograms are reflected by one of a plurality of planar mirrors arranged along a parabolic line about a focus point which is coincident with an array of photoreceptors. The photoreceptors are arranged identically to the light emitters. When the hologram is to be scaled, the photoreceptors and light emitters are optically matched. The arrangement is such that path lengths from the receptors to all of the addressable areas of the holographic medium are the same and preferably the same length as the path lengths between the light emitter array and the record storage medium.

Optimally, the emitter array and the receptor array are symmetrically disposed with respect to the reference plane of the record storage medium. This symmetry includes subtending like-sized angles on opposite sides of the reference plane.

The foregoing and other objects, features, and advantages of the invention will be apparent from the following more particular description of the preferred embodiments of the invention, as illustrated in the accompanying drawings.

DESCRIPTION OF THE PREFERRED EMBODIMENT

Figure 1:
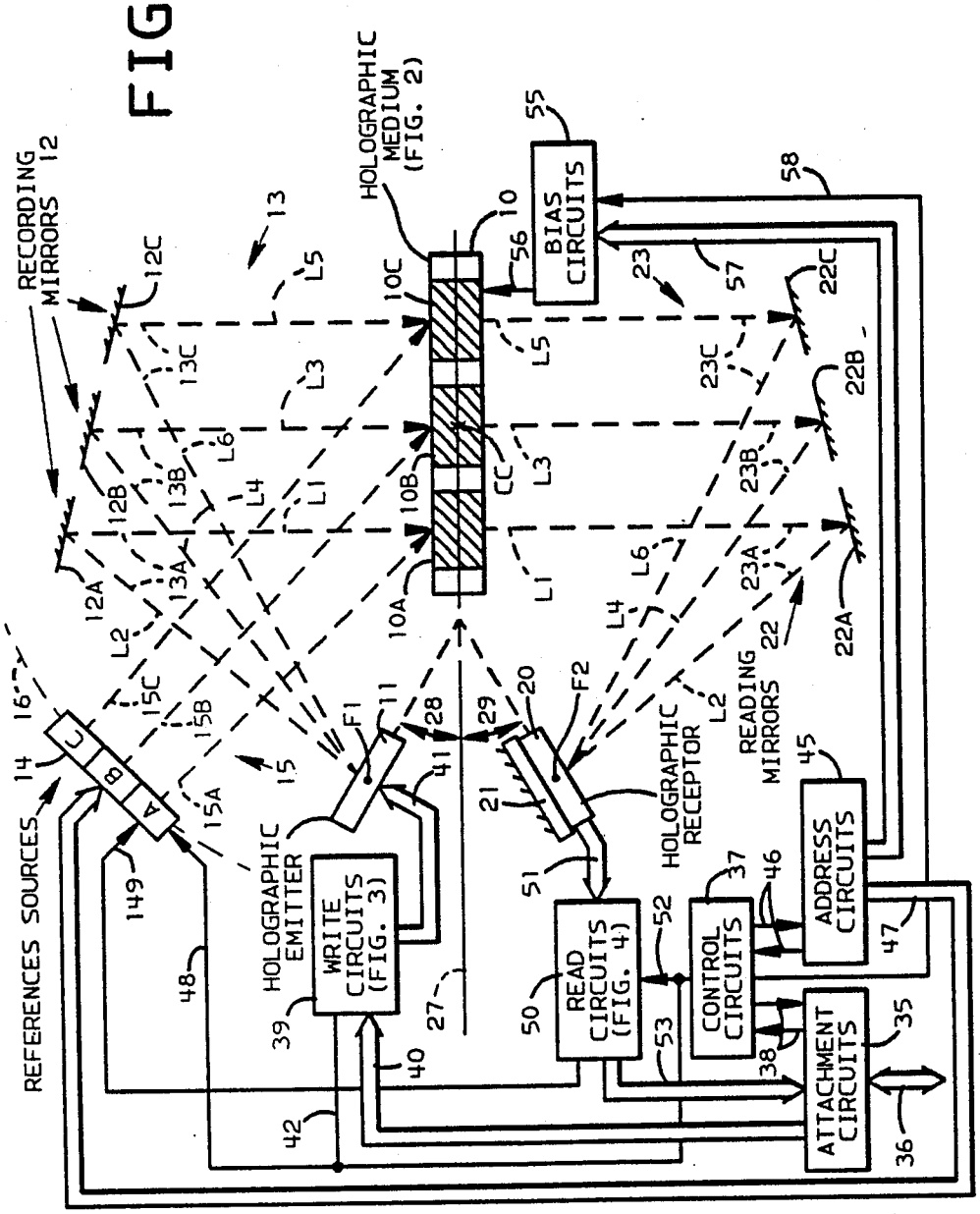
FIG. 1 diagrammatically illustrates apparatus incorporating the present invention.

Referring now more particularly to the drawings, like numerals indicate like parts and structural features in the various figures. A holographic storage medium 10, such as a flat plate employing crystalline bismuth silicon oxide as a holographic storage element, receives light arrays for storage as holograms from holographic emitter 11 via a plurality of planar first surface recording mirrors 12 disposed to form a parabola having its focal point F1 at holographic emitter 11. The arrangement is such that mirror 12A reflects light from emitter 11 to area 10A of holographic medium 10, while mirrors 12B and 12C, respectively, reflect the emitter 11 light to areas 10B and 10C of holographic medium 10. Holographic emitter 11 supplies its emitted light to all of the recording mirrors 12, either by electronic or electromechanical means. The arrangement is such that the effective lengths of the various light paths between holographic emitter 11 and the holographic medium 10 are identical. For example, light path 13A extending between holographic emitter 11 and area 10A includes a length L1 between holographic medium 10 and mirror 12A and a second portion having length L2 between mirror 12A and holographic emitter 11. Similarly, path 13B has lengths L3 and L4, while path 13C has lengths L5 and L6. To record a hologram of the volume type in holographic medium 10, the medium is activated electrically, as later described, and one, and only one, of the holographic storage sections 10A, 10B, or 10C and receives hologram-creating light from reference light source 14 via any one of a plurality of light beams 15. Portion A of reference light source 14 emits light beam 15A to holographic storage section 10A for recording the hologram-creating interference pattern produced by the light from holographic emitter 11 and portion A of reference light source 14. The angle of incidence of light beam 15A to section 10A of holographic medium 10 determines the location within medium 10 at which the created hologram resides. In a similar manner, portions B and C of reference light source 14 emit reference light beams 15B and 15C, respectively, for recording interference patterns with the holographic emitter 11 emitted light in sections 10B and 10C of holographic medium 10. For creating a family of holograms within holographic medium 10 in any of the sections 10A–10C, reference light source 14 is moved along a circular or hemispheric path 16 having a center of curvature CC about the geometric center of holographic medium 10. Changing the angle of incidence of the reference light beams 15 creates a different hologram within holographic medium 10. When holographic medium 10 has a linear array of sections 10A–C along a single line, then path 16 is implemented by an arcuate track. When a rectangular array M by N (where M and N are integers) of holographic sections is employed, then path 16 is implemented by a hemispheric transport. Such an arrangement can be provided by ball and socket connections wherein the reference light source 14 is mounted on the hemispheric surface of the ball immediately adjacent to the concave hemispheric surface of the socket. The ball in such an arrangement is preferably a hemispheric cup opening toward holographic medium 10 with reference light source 14 suitably mounted in the bottom of the cup.

Rather than having a movable reference light source 14, a plurality of addressable solid-state lasers can be disposed along line 16. Yet other reference light sources can readily be envisioned. For example, a plurality of first-surface mirrors can be disposed along line 16. A single laser may have its emitted light addressably deflected to a one of such mirrors for selecting a one of the storage segments and reflect light to the selected segment at a predetermined angle.

The above description relates to the recording portion of the FIG. 1 illustrated system. Next the read-back portion is described, wherein a light beam from reference light source 14 is directed to one of the sections 10A–C of holographic medium 10 with the holographic emitter 11 being quiesced. One of the reference beams 15 shining on one of sections 10A–C results in a hologram being transmitted from holographic medium 10 along one of the light paths 23 extending from holographic medium 10 to holographic receptor array 20 via one of the mirrors in the parabolic reading mirror array 22. Receptor array 20 is located at the focal point F2 of a parabola defined by the mirrors 22A, 22B, and 22C. Holographic receptor array 20 is secured to a three-dimensionally movable carriage assembly 21 for providing alignment and focusing motions, as later described. The receptor 20 consists of a rectangular array of photoreceptor cells, one cell per pixel of the hologram. Light path 23A extends from section 10A to holographic receptor 20 via mirror 22A, while light paths 23B and 23C, respectively, extend from sections 10B and 10C to holographic receptor 20 via mirrors 22B and 22C. The lengths of paths 23A, 23B, and 23C are identical and equal to the path lengths of paths 13A–C as respectively indicated by the lengths L1–L6.

The above-described arrangement shows an array of holographic storage sections 10A–C within a planar holographic medium 10 addressable by reference light source 14 and later-described electrical field energization circuits for enabling a single holographic emitter 11 to record a hologram in any one of the sections 10A–C. Similarly, a single holographic receptor 20 can receive a hologram from any of the sections 10A–C. When the FIG. 1 illustrated apparatus is used as an information or data processor, then the various stored holograms can mix the light beams from the holographic emitter 11 with the stored holograms for performing array processing functions detectable via receptor 20. The holographic emitter 11 is quiesced whenever the FIG. 1 illustrated apparatus is retrieving information-bearing signals from storage medium 10.

Figure 5:
FIG. 5 illustrates some of the relative detector to emitter-orientation effects associated with the FIG. 1 illustrated system.

Examination of the FIG. 1 illustrated apparatus shows various angles of incidence of light to and from holographic image array 10. It is well known that, depending upon the angle of incidence, the size of the projected arrays will vary. For example, as illustrated in FIG. 5, numeral 24 indicates the ideal apparent detector orientation. Depending upon the angle of incidence, the size of the projected array is reduced in size as indicated by dashed and dotted lines 25, 26 which can result in error conditions or, at best, decreased signal-to-noise ratio in the holographic processor. Accordingly, it is desired to have a consistent projection in the holographic receptor 20 which always corresponds to the holographic emitter 11 emitted light beams. The FIG. 1 illustrated apparatus achieves this function by aligning holographic medium 10 along a center reference plane 27, arranging the mirrors 12 and 22 symmetrically to plane 27, keeping all of the light paths 13 and 23 of identical lengths and symmetrically disposing the holographic emitter 11 and the holographic receptor 20 with respect to plane 27. This symmetry includes equal angles 28 and 29 subtended between the emitter array of photoelements of emitter 11 and the receptor photoelements of receptor 20. Such an arrangement also requires that the parabola as defined by the mirrors 12 and 22 be identical and have identical spatial relationships to the storage sections 10A–C. It is also preferred that the portions of the paths 13 and 23 subtending lengths L1, L3, and L5 be substantially orthogonal to the reference plane 27. This arrangement assures that the holograms transmitted from holographic medium 10 by the reference beam 15 onto the reading mirror 22 always follow the illustrated paths.

Recording signals onto holographic medium 10 and reading back the recorded signals are next described. Attachment circuits 35 connect the FIG. 1 illustrated information-bearing-signal storage system to one or more host processors or other data-source links via a set of optical fibers or cables represented by double-headed arrow 36. Attachment circuits 35 can be those attachment circuits found in present-day peripheral data storage apparatus. Control circuits 37 operate the illustrated data storage system and are constructed similarly to present-day peripheral data storage controllers. Control circuits 37 are coupled to attachment circuits 35 via command and status signal paths 38 for receiving requests and instructions from a connected host processor (not shown) and for supplying status information to that host processor. It is to be appreciated that each of the holograms stored in the holographic medium 10 is separately addressable.

For recording information-bearing signals onto holographic medium 10, instructions received from the connected host processor, as interpreted by control circuits 37, prime the illustrated system for receiving data. The data is received through attachment circuits 35 and transferred to a set of write circuits 39 (detailed in FIG. 3) via a cable or optical fiber 40. Write circuits 39 accumulate the received data for creating an "image form" of the data suitable for storage as holograms. The term "image form" means the input data is arranged into a rectangular array of groups of bits; each pixel in the hologram corresponding to the binary value of each group. For example, a sixteen-intensity-level pixel represents four bits in one group—the input data array then being arranged as a M×N (M and N are integers) array of four bit groups. The input data array of encoded and reformatted data is transferred over data paths, which may be a cable or optical fiber, to the holographic emitter 11. Write circuits 39 are suitably controlled by control circuits 37, as indicated by control line 42.

The addressing of the holographic storage sections 10A–C in holographic medium 10 is handled through address circuits 45, which are coupled to control circuits 37 via a set of signal transferring lines 46. The addresses are received from the connected host processor through attachment circuits 35 and are interpreted and adapted for the following described addressing by circuits 45. Two levels of addressing are provided. A first level is through the positioning and actuation of reference light source 14 as controlled by address circuits 45 via address path 47. The operation of reference light source 14 is timed in an usual manner by timing control signals supplied over line 48 to the reference light source 14 by control circuits 37. The supplied addresses to reference light source 14 select one of the three sections 10A, 10B, or 10C to emit its corresponding light beam 15 for selecting one of the three sections 10A, 10B, or 10C. Further, the positioning of reference light source 14 along hemispheric support 16 provides further addressing by changing the angle of incidence of the referenced light beams 15 to the surface of holographic medium 10.

When the holographic medium 10 is of a crystalline type which is activated by electrical fields provided in the medium, such as may be used for bismuth silicon oxide, a second level of addressing to select a section 10A–C for recording is provided by bias circuits 55, as later detailed. Connection 56 represents the later-described electrode connections for selecting that portion of the holographic medium 10 to receive a hologram for recording. Address path 57 connects address circuits 45 to bias circuits 55 for making the appropriate electric field selection. The timing is provided by control circuits 37 supplying timing signals over line 58 to bias circuits 55. The read-back of stored holograms from holographic medium 10 is controlled by read circuits 50 as detailed in FIG. 4. Data path 51 transfers the received and detected hologram signals sent by receptor 20 to read circuits 50 for decoding and reformatting, as detailed in FIG. 4. Control path 52 transfers timing and other control signals from control circuits 37 to read circuits 50 for timing and managing read-back operations. Output data path 53 transfers the decoded and reformatted signals (reformatted from the "image form" array to serial by word or byte, i.e., data transfer of one byte in word at a time) from read circuits 50 through attachment circuits 35 to the host processor using present-day data transfer techniques.

Figure 2:
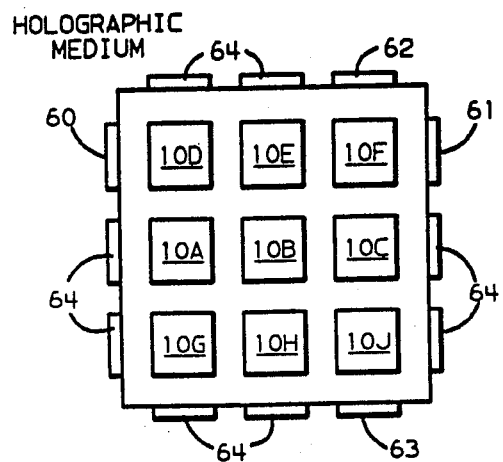
FIG. 2 is a diagrammatic plan view of a holographic medium used in the FIG. 1 illustrated system.

FIG. 2 illustrates, in simplified form, a two-dimensional planar array of hologram-storing sections 10A–J in a holographic medium 10. In such a medium consisting of bismuth silicon oxide, a plurality of electrodes 60–64 are disposed on and electrically attached to the body of holographic medium 10 for selectively inducing electric fields within the medium for enabling recording of holograms. For example, when an electric field is provided between electrodes 60 and 61, then any of the sections 10D, 10E, or 10F, or all three, can receive a hologram. The reference light beam 15 shining on one of the three sections 10D–F selects which of the three will in fact receive information-bearing signals for storage as a hologram. In a similar manner, an electric field induced between electrodes 62 and 63 enables sections 10F, 10C and 10J to receive data for storage as holograms. Electric fields also can be induced between electrodes 63 and 60, as well as between other pairs of electrodes. The significance of inducing different electric-field combinations results in different electric fields within the medium. Such different electric fields enable the storage of data as holograms in different areas throughout the medium.

Overlaying a plurality of holograms in any one of the hologram storage sections tends to reduce the signal-to-noise ratio and the relative intensity of the stored hologram. Such reduction in intensity can induce errors in the read-back of data from those holograms. Accordingly, as later described, an automatic intensity gain-control apparatus is included in the FIG. 1 illustrated data storage system for accommodating such variable intensities.

Figure 3:
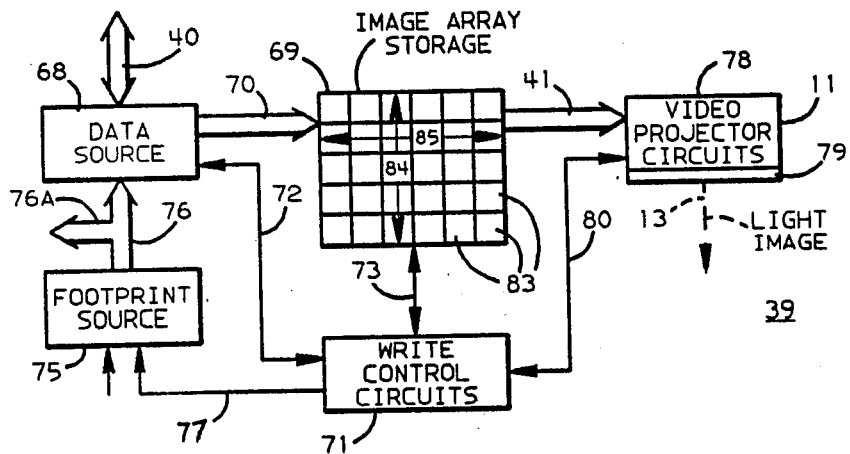
FIG. 3 is a block diagram illustrating write or recording circuits used in the FIG. 1 illustrated system.

Such regeneration and recording of holograms is better understood by referring next to FIG. 3. The data to be recorded is received by write circuits 39 over input data path 40. Data source 68 receives the data, adds suitable error detection and correction redundancies, as is well known, and arranges the received data into pixel groups of bits for storage in image array storage 69 via data path 70. The sequencing of operation of write circuits 39 is managed by write control circuits 71 which time the transfer of signals from data path 40 to the emitted light image 13. Control path 72 carries the suitable control and timing signals from circuit 71 to data source 68 and returns suitable status information, as is usually practiced in write circuits for various types of data recorders. In a similar manner, control and status path 73 extends from write control circuits 71 to image array storage 69. Image array storage 69 is divided into the pixel storage areas 83. The received data is transferred from data source 68 into image array storage 69 beginning in the upper left-hand corner and proceeding horizontally to complete a first row, then from left to right on succeeding rows until the array is filled. Each pixel data storage area stores a small number of bits which are translated into the hologram as one of a plurality of intensity levels. For example, if four bits are stored in each pixel area, then one of 16 intensity levels can be provided in the hologram. For eight bits being stored in each pixel area, any one of 256 possible intensity levels are stored. The number of data bits for each pixel area is empirically determined in accordance with design parameters for error detection and correction, sensitivity of detection of such intensity levels and what error rates can be accommodated.

As mentioned earlier, the intensity of a stored hologram can vary after storage by overlaying other holograms in the same hologram-storing section. To accommodate such subsequent variations, a footprint source 75, which can consist of a read-only memory (ROM), supplies footprint information over data path 76 to data source 68 and over cable 76A to read-back circuits for detection of the hologram. Footprints can be deleted from the detected holograms.

The finally assembled data bits and later-described footprints are transferred to holographic emitter 11 via data path 41. Emitter 11 consists of conventional video projector circuits 78, which convert the image-array-stored data from storage array 69 into video images which are projected by the projector 79 as a light image over path 13. The combination of image array storage 69 and the emitter 11 is similar to a video display terminal in that the image array storage 69 is equivalent to the refresh storage, and the video projector circuits 78 are equivalent to the display control circuits. A difference is that the refreshing of the projected light image over path 13 is limited to the time required to store the hologram in holographic medium 10, and that phase-coherent (laser) light is transmitted to record medium 10. Video projector circuits 78 are controlled by write control circuits 71 as indicated by the control connection 80. Such control follows usual control for video display and projection.

The emitter array 79 is preferably constructed using either an acousto optic modulator device (ADD) array or an array of transmissive liquid crystal devices (LCD). These devices are available on the market, and their construction and usage are known. For example, two-dimensional ADD arrays can be obtained from ISOMET, Springfield, Va. (Model LS50-XX), while transmissive LCD arrays can be obtained from Epson America, Inc., Torrance, Calif. (Model ET-10).

Write control circuits 71 also provide control signals to footprint source 75 via path 77. For example, more than one footprint may be provided for identifying the class of data stored in the given hologram. For separating a footprint from a stored data image, the address of the hologram and the footprint characteristics are stored in a table (not shown) of the connected host processor (not shown) as reported to the host processor by control circuits 37. Alternately, the host processor can specify which footprint will go with each hologram and indicate to the holographic storage system which footprint is to be used. In the preferred embodiment, a footprint consists of a set of crossed lines in the projected light image having a predetermined intensity which can be used to calibrate the intensity of a read-back hologram. As seen in FIG. 3, the footprint consists of two crossed lines 84 and 85. Line 84 fills a column while line 85 fills a row with light intensity representing signals which are predetermined such that a reference intensity signal can be used for calibrating the hologram intensity. For example, if four bits are stored in each pixel area, then a value of nine can be used as a footprint. Value 9 is selected because it is an intermediate intensity. Any predetermined pattern may be employed for calibration; empirical testing may be required to obtain optimal results.

Figure 4:
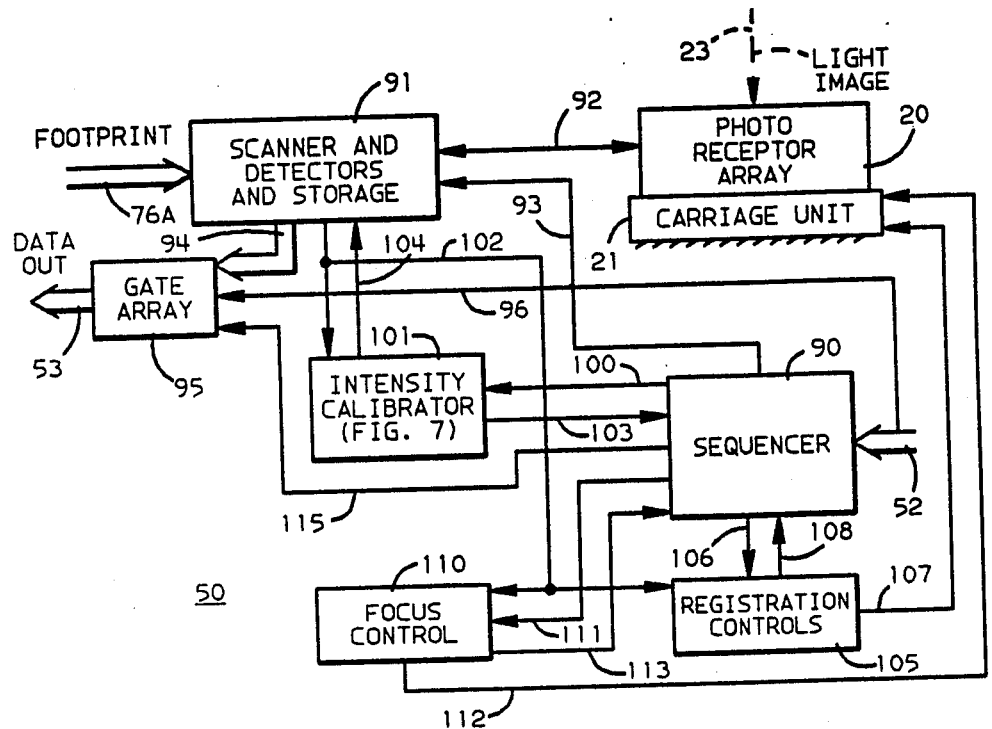
FIG. 4 is a block diagram of read-back circuits used in the FIG. 1 illustrated system.

FIG. 4 illustrates the read-back and data reformatting of stored holograms. The timing and sequence of the read circuits 50 are controlled by sequencer 90, which is constructed using known read-back sequencing circuits. The design of each sequencer 90 is dependent upon a selected data format, the speed of the processing circuits and the size of the data units being processed, i.e., the number of bits of data stored in each hologram, for example. Sequencer 90 is controlled by control circuits 37 via control path 52. A key portion of read circuits 50 includes the scanner, detector and storage unit 91, which is connected to the photoreceptor array 20 by data path 92. Photoreceptor array 20 receives the light image over path 23. The array 20 consists of a rectangular array of photodetector elements, one for each pixel in the stored hologram, which are addressable by rows and columns. The output of the array is a composite intensity-indicating signal for a row and a composite intensity-indicating signal for a column. Known video processing circuits within the scanner and detector unit 91 convert the analog intensity representations of each pixel to the bits stored in each pixel group. For example, when four bits are stored in a pixel group, an analog-to-digital corrector (not shown) within unit 91 quantizes the received video intensity to one of 16 possible intensity levels. Such quantization is then converted into four bits which is a faithful reproduction of the originally stored data. Error detection and correction redundancies accommodate misdetection of the intensity levels, as is done for all forms of recording. Unit 91 includes an image array storage (not shown) similar to image array storage 69 of FIG. 3 for facilitating error detection and correction. That is, the detected pixel values are stored into respective pixel storage areas 83. The pixel data is then analyzed using known error detection and correction techniques before being sent over path 94 to gate array 95, which commutates the stored array data into a series of data bytes to be transferred over multibit path 53 to attachment circuits 35. Sequencer 90, during data read-back, supplies control signals over control paths 93 to scanner, detector and storage unit 91. The gates (not shown) in gate array 95 are enabled by control signals on line 96 received from control circuits 37 via control path 52. Sequencer 90 supplies an enabling signal over control path 115 for passing the detected data after the following-described detection circuit calibration.

Calibration of read circuits 50 relates to three holographic parameters. A first parameter, intensity calibration, was discussed previously and in the preferred embodiment is the first parameter to be calibrated. The second parameter is the registration with the photoreceptor array 20 of the incoming holographic light image on a path 23. A third parameter is the focus of the image. The latter two parameters are calibrated via actuation of carriage unit 21.

Sequencer 90, in response to a control signal received from control circuits 37 over path 52, supplies a control signal over path 100 to intensity calibrator 101. Calibrator 101 is detailed in FIG. 7. Calibrator 101 receives the detected signals of the light image from unit 91 over path 102 and supplies control signals to unit 91 over path 104. As soon as calibrator 101 has calibrated the intensity of the hologram being received, it supplies a complete signal over path 103 to sequencer 90. Registration of the pixels with the photoreceptors or photocells in array 20 is initiated by sequencer 90 supplying an initiation signal over signal path 106 to registration controls 105. Registration controls 105 receive the scanned input signals from unit 91 over path 102 for measuring the registration. The footprints 84–85 are used for implementing registration of the incoming light beams to the photoreceptor array 20. Registration controls 105 supply carriage positioning signals over path 107 to carriage unit 21 for moving photoreceptor array 20 in an x-y dimension perpendicularly to the axis (not shown) of incoming light beam 23. Registration of incoming light beams with photoreceptor arrays is well known in the art and is not described for that reason. Upon verifying registration of the pixels with the photoreceptor array 20 photocells, registration controls 105 supply a completion signal over path 108 to sequencer 90.

In response to the registration completion signal, sequencer 90 initiates focusing the incoming light to the photoreceptor array by activating focus controls 110 via an initiation signal over path 111. Focus controls 110 respond to the signals supplied over line 102 from unit 91 to generate a focus error signal. Focus error signal travels over path 112 to carriage unit 21 for moving photoreceptor array 20 along the axis (not shown) of the incoming light beam 23 for focusing the light, as is well known. Various forms of focus detectors can be used within the photoreceptor arrays; for example, a knife-edge detector can be employed and incorporated into photoreceptor array 20. With this error signal being supplied to unit 91 over path 92, unit 91 in turn relays the focus error signal over line 102 to focus controls 110. Controls 110 then generate a servo control signal for a focusing movement of carriage unit 21. Since such focus controls are well known, they are not detailed here. Upon obtaining appropriate focus, controls 110 supply a focus completion signal over signal path 113 to sequencer 90 signifying the completion of the calibration procedures. Sequencer 90 then responds by supplying an activating signal over path 115 to gate array 95 and an initiate data read signal over line 93 to unit 91. The combination of the focusing and registration steps can be sequenced for facilitating scaling of a hologram.

Figure 6:
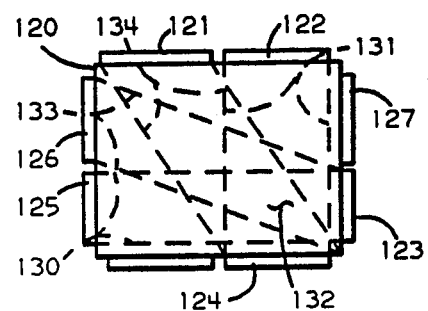
FIG. 6 is a diagrammatic illustration of electric field selection of holographic areas for a holographic medium used in the FIG. 1 illustrated system.

FIG. 6 diagrammatically illustrates the biasing effects of electrodes on a holographic storage medium 120. Electrodes 121 through 127 provide for generation of electric fields in the medium for the reception of storage of holograms created by light interference patterns from a reference means and an information-bearing beam. Dashed lines 130 represent a first electric field between electrodes 123 and 125 for receiving light to create a hologram. Dashed lines 131 represent a similar field extending between electrodes 122 and 124, at a different time, of course, for creating holograms between those two electrodes. Area 132, which is the intersection of the lines 131 and 130, can store holograms based upon the electric field from either pair of electrodes 122, 124 or 123, 125. Two holograms stored in area 132 will not interfere with each other, but will reduce the relative intensities of the stored holograms, requiring the above-described intensity calibration. Third and fourth holographic zones are represented by numerals 133 and 134. Various combinations and overlapping of these hologram storage areas result in variations in the intensities but do permit "stacking" of holograms in the storage medium 120 volume.

Figure 7:
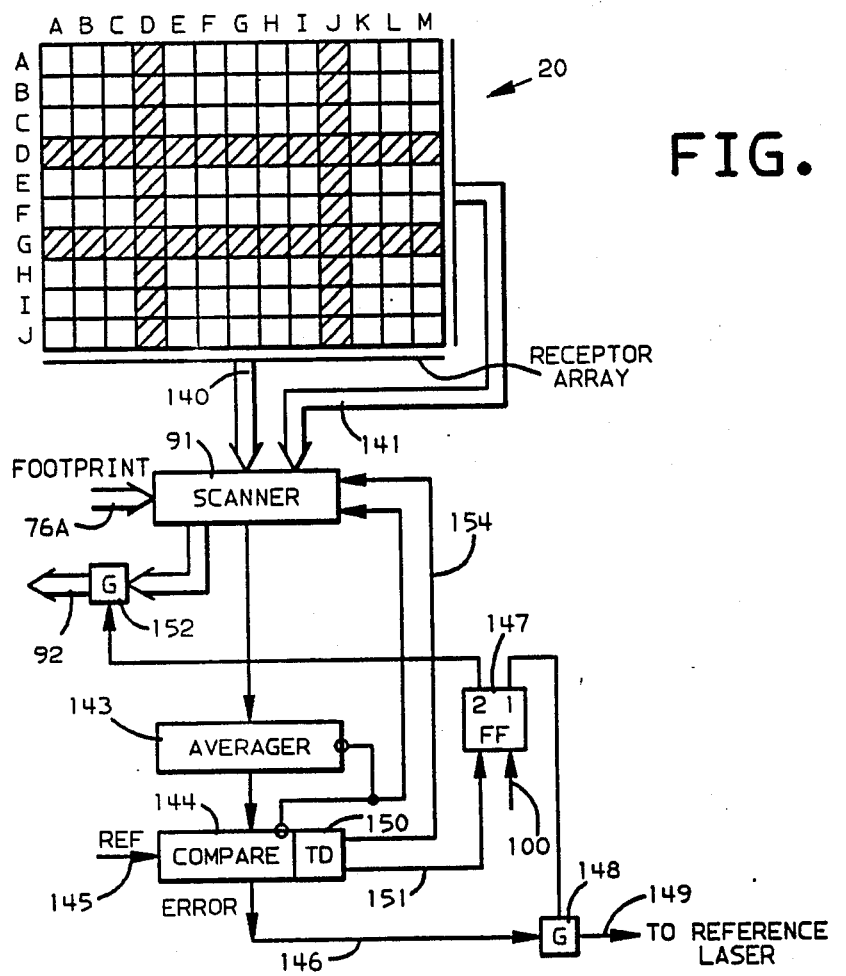
FIG. 7 illustrates, in block diagram form, intensity calibration circuits usable with the FIG. 4 illustrated circuits.

FIG. 7 illustrates the intensity calibration circuits of calibrator 101. Receptor 20 is shown in diagrammatic form with each unnumbered square representing a photoreceptor. The alphabetic characters A–M along the top of the array represent the column designations, while the left-hand alphabetic characters A–J represent the row designations. The shaded squares represent the footprint of the incoming image. The columns A–M are scanned serially from left to right as represented by the numeral 140, while the rows A–J are scanned from top to bottom as represented by the numeral 141. Scanner unit 91 provides the scanning of the rows and columns, as is well known. The scanner of unit 91 is personalized by the footprint signal received over path 76A from footprint source 75 (FIG. 3). Such personalization consists of gating circuits which respond to the footprint signal to divert the signals representing the footprint from the data stream to the calibration circuits. Such diversion of signals, using gating means and column and row addresses, is well known. The scanner 91 serially supplies the scanned signals to averager 143. Averager 143 can be an analog integration circuit. It is to be understood that the read-back signals from the receptor 20 can be digitized with the averager 143 being of the digital type. Averager 143 supplies its averaged signals at the end of a scan of both columns and rows of the footprints as represented by the shaded lines. To compare circuit 144, the scan timing controls and scan completion signal are not shown for brevity. Compare circuit 144 compares the received averaged calibration light intensity representing signal with a reference signal (which can be in numerical value) supplied over line 145 as from a voltage divider circuit and the like. For a digitalized implementation, reference line 145 is replaced by a digital register storing a number indicative of the normalized pixel intensity value. Compare circuit 144 generates an error signal supplied over line 146 which is used as later described to adjust the magnitude of the signals being supplied to match the reference signal on line 145.

Calibration and scanning are initiated by sequencer 90 (FIG. 4) supplying its initiation signal over line 100 for setting flip-flop FF 147 to a first or calibrate state for activating scanner 91, enabling averager 143 and compare circuit 144 to perform the to-be-described calibration function. When flip-flop FF 147 is in the first state, analog gate 148 passes the error signal on line 146 to line 149 connected to the reference light source 14 laser. The output intensity of the laser, such as a solid-state laser, is changed for changing the intensity of the reference beam 15 and, hence, the readout intensity of the hologram. This calibration loop continues until threshold detectors TD 150 determine that the difference between the averager 143 output signal value and the reference signal value at line 145 is sufficiently small that further changes to the referenced laser are unnecessary. Then threshold detector TD 150 supplies an END signal over line 151 setting flip-flop FF 147 to a second, or operate, state. This action disables analog gate 148 and enables gates 152 for supplying the scanned signals on to path 92 as read-back signals. Calibration is also obtained in a facile manner by inserting variable gain amplifiers in the paths 140, 141. The gain of such amplifiers are adjusted as described above by connecting line 149 to the gain control input of such amplifiers and holding the gain control constant upon termination of the calibration. The repetitive scans of the rows and columns of receptor array 20 are reinstituted by threshold detector TD 150 supplying a signal over line 154 for initiating scanner 91 to step through another cycle.

While the invention has been particularly shown and described with reference to preferred embodiments thereof, it will be understood by those skilled in the art that various changes in form and details may be made therein without departing from the spirit and scope of the invention.

What is claimed is:

1. In an optical processor, in combination:
    a planar array of hologram sections disposed along a central axis with each of said hologram sections for containing at least one hologram;
    a first array of planar mirrors disposed along a parabolic line and each planar mirror facing a respective one of said hologram sections for reflecting radiation to be transferred to or from the respective hologram sections and disposed with respect to the hologram sections such that the radiation arrives at and leaves the hologram sections orthogonally to said central axis; and
    a holographic emitter disposed intermediate said central axis and said parabolic line at about the center of focus for the parabolic line, having an array of photoelements disposed at a predetermined angle with respect to said center line and said array of photoelements facing all of said mirrors in said first array of planar mirrors such that the effective light path lengths between any one of said hologram sections and said holographic emitter are substantially identical.

2. In the optical processor set forth in claim 1, further including, in combination:
    a reference light source facing said planar array of hologram sections for supplying a light beam to one of said hologram sections.

3. In the optical processor set forth in claim 2, further including, in combination:
    hemispherical support means movably supporting said reference light source for circular motions about a center of rotation disposed in said planar array of hologram sections whereby a plurality of holograms may be contained in each of said hologram sections.

4. In the optical processor set forth in claim 3, further including, in combination:
    said planar array of hologram sections consisting of electro-optic material;
    electrode means on said electro-optic material for inducing electric fields in the material that are localized to predetermined ones of said hologram sections for recording holograms in said predetermined ones of said hologram sections; and
    means connected to said electrode means and to said reference light source for coordinating activation of said electrode means and said reference light source such that a hologram can be stored in a predetermined one of said hologram sections.

5. In the optical processor set forth in claim 2, further including, in combination:
    a second array of planar mirrors disposed along a second parabolic line and each planar mirror in the second array facing a respective one of said hologram sections for reflecting images to be transferred to or from the respective hologram sections such that the images arrive at and leave the hologram sections orthogonally to said central axis, said first array of planar mirrors being disposed facing a first face and said second array of planar mirrors being disposed facing a second face of said planar array of hologram sections such that one planar mirror in each of said arrays of planar mirrors faces a one of said hologram sections faced by a planar mirror of another array of planar mirrors; and
    a holographic receptor facing said array of planar mirrors and disposed on the opposite side of said center line and at said predetermined angle therewith and being disposed at the focal point of a parabola defined by said second array of planar mirrors.

6. In the optical processor set forth in claim 5, further including, in combination:
    circuit means coupled to said holographic emitter and receptor and to said reference light source for addressably accessing said hologram sections for storing and retrieving information-bearing signals therein and therefrom.

7. In the optical processor set forth in claim 6, further including, in combination, in said circuit means:
    pixel means for defining pixel storage areas in said images being stored in said hologram sections as holograms;
    data handling means connected to said pixel means for inserting for storage a predetermined number of bits in predetermined ones of said pixel storage areas;
    video means connected to said pixel means and to said data handling means for generating an intensity level for each pixel storage area representative of the value represented by said predetermined number of bits and for supplying an image having said intensity level to an addressed one of said hologram sections.

8. In the optical processor set forth in claim 7, wherein:
    path lengths between any one of said hologram sections and either one of said photodetector array portions are identical and the holographic emitter and holographic receptor are on opposite sides of said central axis at an identical distance; and
    said reference light source is disposed on the side of said center line with said image emitter and has a plurality of light sources individually actuable with said light sources directed at different ones of said hologram sections whereby switching different ones of said plurality of light sources selects different ones of said hologram sections.

* * * * *